United States Patent
Lin et al.

(10) Patent No.: US 8,502,080 B2
(45) Date of Patent: Aug. 6, 2013

(54) FLEXIBLE PRINTED CIRCUIT BOARD WITH WATERPROOF STRUCTURE

(75) Inventors: Gwun-Jin Lin, Taoyuan County (TW); Kuo-Fu Su, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 338 days.

(21) Appl. No.: 12/967,488

(22) Filed: Dec. 14, 2010

(65) Prior Publication Data

US 2012/0018196 A1    Jan. 26, 2012

(30) Foreign Application Priority Data

Jul. 22, 2010    (TW) .............................. 99124218 A

(51) Int. Cl.
*H05K 1/00* (2006.01)
(52) U.S. Cl.
USPC ......................................................... 174/254
(58) Field of Classification Search
USPC ................. 174/250–251, 254–258, 260, 262, 174/268; 361/749, 752
See application file for complete search history.

(56) References Cited

U.S. PATENT DOCUMENTS
2011/0031703 A1    2/2011    Hayashi

FOREIGN PATENT DOCUMENTS
JP    2007-200747 A    8/2007
WO    2009/139223 A1    11/2009

OTHER PUBLICATIONS

Communication Dated Dec. 17, 2012 From Chinese Patent Office Regarding a Counterpart Foreign Application.

*Primary Examiner* — Jeremy Norris
*Assistant Examiner* — Tremesha S Willis
(74) *Attorney, Agent, or Firm* — Rosenberg Klein & Lee

(57) ABSTRACT

A flexible printed circuit board with waterproof structure includes a flexible substrate that has a first surface having a first metal layer bonded thereon. The first metal layer forms a covered area and at least one mounting zone. A bonding strength enhancing structure is formed on the mounting zone. A first insulation layer is formed on the covered area of the upper surface of the first metal layer in such a way to expose the mounting zone. A water resistant member is bonded to the bonding strength enhancing structure and a second surface of the flexible substrate.

14 Claims, 5 Drawing Sheets

FLEXIBLE PRINTED CIRCUIT BOARD WITH WATERPROOF STRUCTURE

FIELD OF THE INVENTION

The present invention relates to a flexible printed circuit board with waterproof structure, and in particular to a flexible printed circuit board having a metal layer, which carries an insulation layer formed thereon and forms a mounting zone that is not covered by the insulation and is thus exposed for receiving a water resistant member mounted thereon, wherein the mounting zone comprises a bonding strength enhancing structure to improve the bonding strength of the water resistant member to the flexible printed circuit board, and the metal layer forms holes through a surface thereof to improve control over impedance against high frequency signals.

BACKGROUND OF THE INVENTION

Flexible printed circuit boards are of wide applications in various electronic devices, such as notebook computers, personal digital assistants, and mobile phones. A conventional flexible printed circuit board is composed of a plurality of conductors that are respectively covered by an insulation jacket and are arranged to juxtapose each other to form a flat structure. The flexible printed circuit board can be connected through electrical connectors or soldering for transmission of electronic signals.

Connecting electronic devices with a flexible printed circuit board is generally of no concern of waterproofing. However, waterproofing may become a problem especially for outdoor applications or for portable devices, such as mobile phones. Taking a mobile phone as an example, the mobile phone comprises a host device portion and a display screen portion that are connected to each other by a flexible printed circuit board that is attached to these portions through connectors or soldering. If waterproofing between the flexible printed circuit board and the host device portion or the display screen portion of the mobile phone is poor, then water may flow along the flexible printed circuit board into the host device portion and the display screen portion.

To effect waterproofing or resistance against humidity, conventionally, a rubber pad is provided as a waterproof or water-resistant member arranged between an enclosure of an electronic device and a flexible printed circuit board, whereby tight engagement is established between the flexible printed circuit board and the electronic device enclosure to achieve the desired effect of waterproofing or resistance against humidity.

SUMMARY OF THE INVENTION

Although directly mounting a water resistant member on an insulation surface layer of a flexible printed circuit board is known and is also effective in achieving waterproofing or resistance against humidity. However, there is still a concern about reliability of water sealing between the water resistant member and the printed circuit board. One of the reasons is that it is hard to properly establish a tight engagement between the water resistant member and the surface insulation material (such as PI and insulation ink) of the printed circuit board. Although surface treating agents may be applied to handle this problem, the resultant waterproofing and bonding strength are not good enough so that any flaw occurring in the manufacturing process will lead to unacceptable bonding strength between the water resistant member and the printed circuit board, causing undesired situations of shifting, separation, leaking of water between the water resistant member and the printed circuit board, which eventually result in poor resistance against water pressures applied thereto.

Further, when a flexible printed circuit board is employed to transmit electronic signals of high frequency, there is always a concern about impedance matching and control of signal transmission time. Since a flexible printed circuit board is of a reduced thickness, the distance between two surface metallic shielding layers and the signals transmitted is very small, leading to excessively low impedance to the signal transmission. A solution to such a problem is to form openings in local area or the whole area of the metallic shielding layers, which always lead to the desired result of impedance. It is thus of a desire to combine a structure for effecting waterproofing and bonding between the water resistant member and the flexible printed circuit board and a structure for controlling high frequency impedance of the flexible printed circuit board, in order to improve the industrial value of a flexible printed circuit board.

Thus, an objective of the present invention is to provide a flexible printed circuit board with waterproof structure, which comprises a flexible substrate carrying a metal layer on which an insulation layer is formed. The metal layer forms a mounting zone that is not covered by the insulation layer and is thus exposed. The metal layer forms holes or corrugation on a surface thereon within the mounting zone in order to improve the bonding strength. A water resistant member is mounted to the mounting zone of the metal layer so that excellent waterproofing and bonding can be realized between the water resistant member and the flexible printed circuit board.

Another objective of the present invention is to provide a water-resistant flexible printed circuit board that features both the waterproofing and bonding between a water resistant member and the flexible printed circuit board and the requirement of impedance for the flexible printed circuit board. With a water resistant member mounted to the flexible printed circuit board being fit to a receptacle opening defined in a device enclosure, excellent bonding strength is realized between the water resistant member and the flexible printed circuit board and the requirement for controlling impedance of a high frequency flexible printed circuit board can also be achieved.

To achieve the above objective, a flexible substrate has a first surface on which a first metal layer is bonded. The first metal layer has an upper surface forming a covered area and at least one mounting zone. A first insulation layer is formed on the covered area of the upper surface of the first metal layer in such a way not to cover the mounting zone of the first metal so as to expose the mounting zone. A water resistant member is securely mounted to the mounting zone of the first metal layer. The flexible substrate also has a second surface to which a second metal layer and a second insulation layer are selectively and sequentially mounted. The second metal layer also forms a mounting zone, which is not covered by the second insulation layer so as to expose for mounting the water resistant member. In the embodiments of the present invention, the water resistant member mounting zone of each metal layer is provided with a bonding strength enhancing structure for securely bonding the water resistant member. The bonding strength enhancing structure comprises at least one hole extending through the upper and lower surfaces of the metal layer or a corrugation structure that does not extend through the upper and lower surfaces of the metal layer. The hole of the bonding strength enhancing structure can be of a shape of circle, square or rectangle, rhombus, ellipse, or triangle. In a preferred embodiment, the hole is of a size that is greater than 0.001 inches. For multiple holes, it is preferable that the holes are distributed uniformly. The holes can be formed through conventional development/etching processes, or printing of silver paste, or bonding of pre-formed holed structure, or secondary printing of holed silver paste layer on a surface of the metal layer to form corrugation. The process is selected according to the material of the layer and the size and distribution density of the holes. The metal layer is made of a material of copper, copper with metallic surface coating, silver paste, silver foil, and aluminum foil.

The water resistant member can be made of a material showing insulating characteristics, or a material showing electrical conduction characteristics. According to the needs of various applications, the material selected helps realizing the effect of insulation, electrical conductivity, or magnetic shielding. When the water resistant member is made of an electrically conductive material, the water resistant member serves to connect the metallic shielding layer of a flexible printed circuit board with a metallic casing to provide improved electromagnetic shielding effect.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
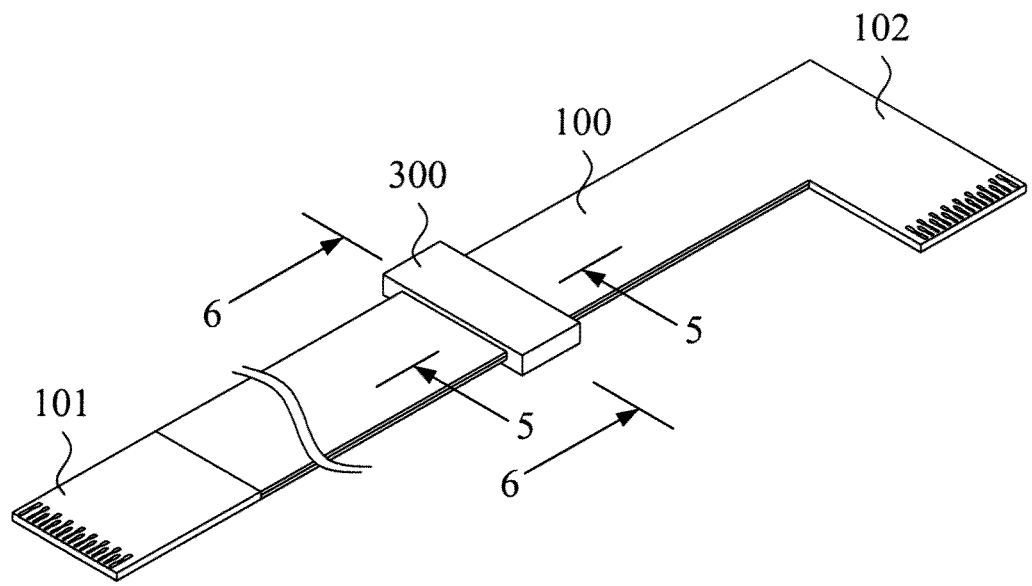
FIG. 1 is a perspective view showing a flexible printed circuit board with water-resistant structure according to a first embodiment of the present invention.
Figure 2:
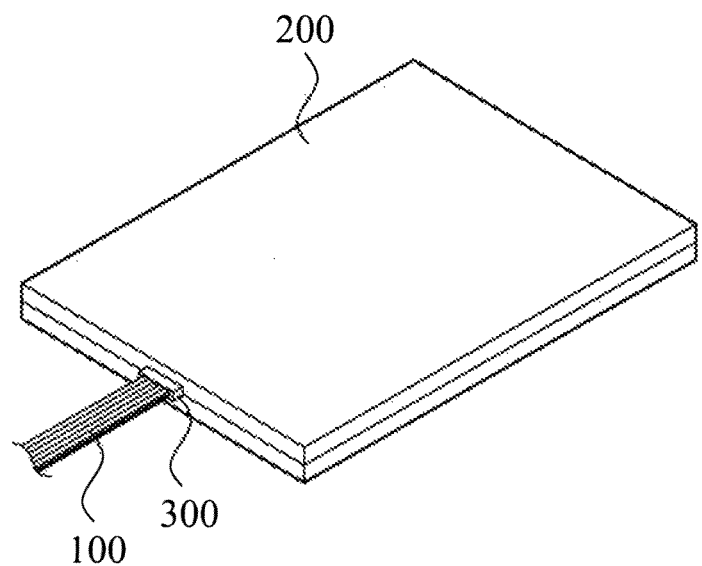
FIG. 2 is a perspective view showing the present invention coupled to a receptacle opening formed in a device enclosure through a water resistant member.

With reference to the drawings and in particular to FIG. 1, FIG. 1 shows a perspective view of a flexible printed circuit board with water-resistant structure according to a first embodiment of the present invention, which is generally designated at 100. The flexible printed circuit board 100 of the present invention, upon coupling to a device enclosure 200 (as shown in FIG. 2), inserts a water resistant member 300 into a receptacle opening defined in the device enclosure 200 to protect the device enclosure 200, which may be an enclosure of an electronic device, from water ingress or invasion.

The flexible printed circuit board 100 is of wide application for use in the enclosure of various electronic devices. For example, when used in the field of mobile phones, the flexible printed circuit board 100 can be attached to a host device portion and a display screen portion through connectors 101, 102 attached thereto. The flexible printed circuit board 100 may be replaced with another type of flexible circuit board or cable, such as a well-known flexible flat cable.

Figure 3:
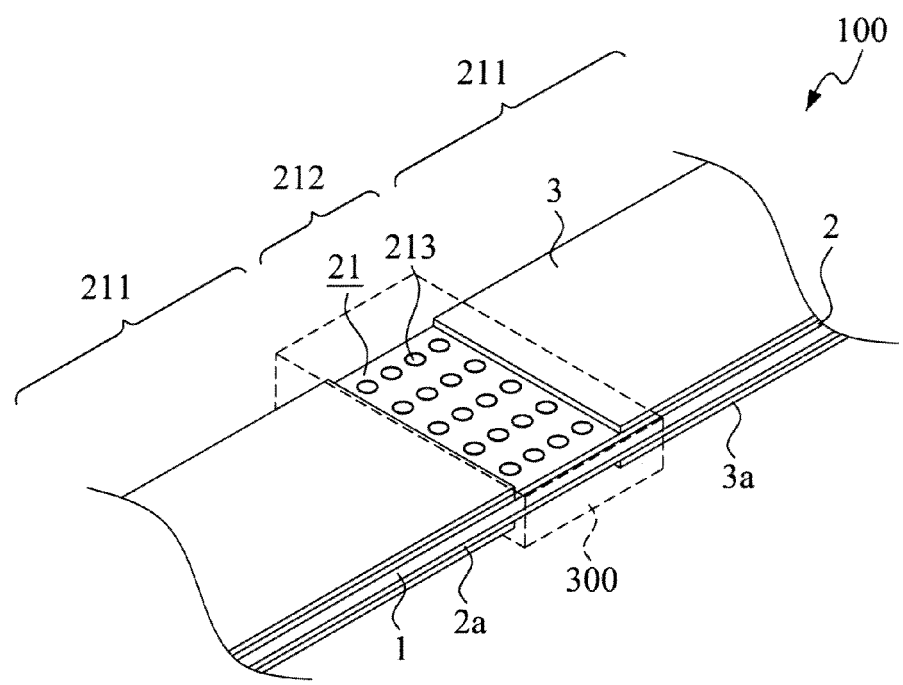
FIG. 3 is a perspective view showing the flexible printed circuit board according to the present invention with the water resistant member removed.
Figure 4:
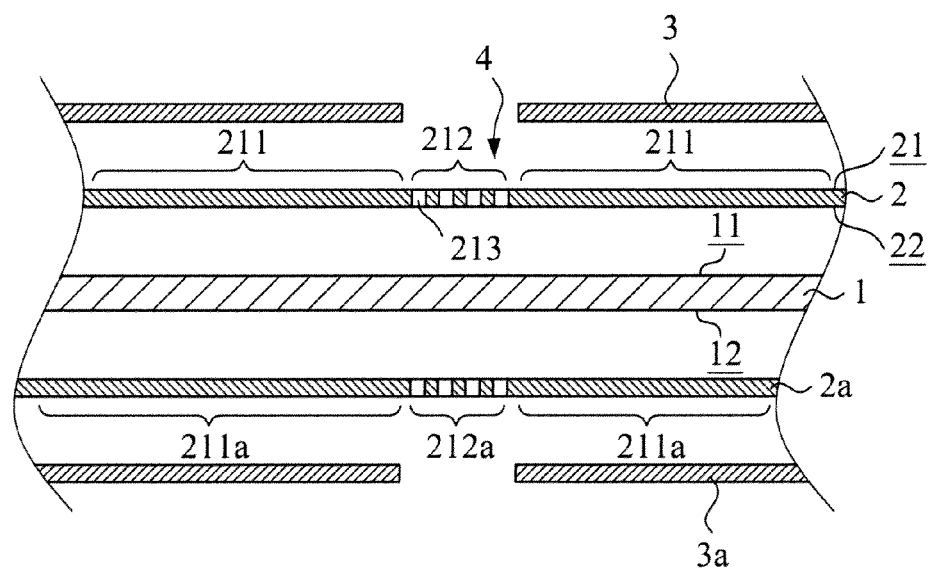
FIG. 4 is a cross-sectional, in an exploded form, of the flexible printed circuit board according to the present invention.
Figure 5:
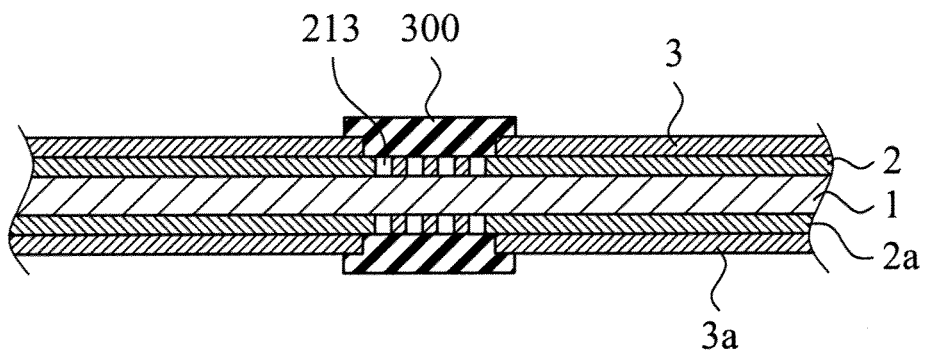
FIG. 5 is a cross-sectional view taken along line 5-5 of FIG. 1.
Figure 6:
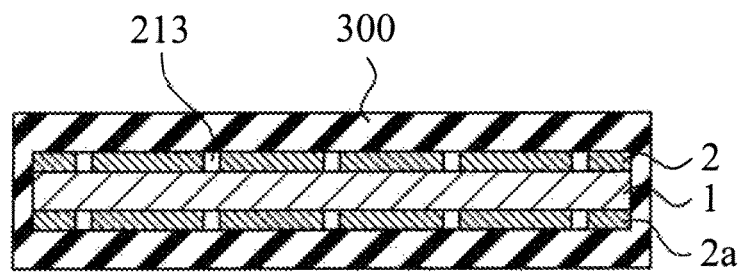
FIG. 6 is a cross-sectional view taken along line 6-6 of FIG. 1.

FIG. 3 shows a perspective view of the flexible printed circuit board 100 according to the present invention with the water resistant member 300 removed. FIG. 4 shows a cross-sectional view, in an exploded form, of the flexible printed circuit board 100 according to the present invention. FIG. 5 shows a cross-sectional view taken along line 5-5 of FIG. 1. FIG. 6 shows a cross-sectional view taken along line 6-6 of FIG. 1.

As shown in these drawings, a flexible substrate 1 has a first surface 11 on which a first metal layer 2 is formed. The first metal layer 2 has an upper surface 21 on which a covered area 211 and at least one water resistant member mounting zone 212 are defined. The first metal layer 2 has an opposite lower surface 22 bonded to the first surface 11 of the flexible substrate 1. The first metal layer 2 may serve as an electromagnetic shielding layer for the flexible substrate 1 and can be made of a material of one of copper, copper with metallic surface coating (such as tin coating and gold coating), silver paste, silver foil, and aluminum foil.

A first insulation layer 3 is formed on the covered area 211 of the upper surface 21 of the first metal layer 2 in such a way that the water resistant member mounting zone 212 of the first metal layer 2 is not covered and is thus exposed.

Similarly, the flexible substrate 1 has an opposite second surface 12 on which a second metal layer 2a is formed. The second metal layer 2a has a lower surface to which a second insulation layer 3a is attached. The lower surface of the second metal layer 2a also forms a covered area 211a and at least one water resistant member mounting zone 212a.

A water resistant member 300 is tightly mounted to the water resistant member mounting zone 212 of the first metal layer 2, the water resistant member mounting zone 212a of the second metal layer 2a, and circumferential portions of the flexible substrate 1. The water resistant member 300 is made of a material showing insulating characteristics, such as silicone rubber, rubber, silica gel, whereby excellent insulation can be achieved through the use of these materials. The water resistant member 300 may alternatively made of a material showing electrical conductivity, such as silicone rubber, rubber, silica gel, or resin, that contains therein electrically conductive particles (such as graphite, silver, nickel), whereby electrical conductivity and magnetic shielding can be achieved through the use of these materials.

Preferably, the water resistant member 300, besides covering the water resistant member mounting zone 212, 212a, additionally covers an interface area between the water resistant member mounting zone 212 and the first insulation layer 3 and an interface area between the water resistant member mounting zone 212a and the second insulation layer 3a.

Within the water resistant member mounting zone 212, the first metal layer 2 forms at least one hole 213 (multiple holes being shown in the embodiment illustrated) extending completely through the upper surface 21 and the lower surface 22 of the first metal layer 2 so as to form a bonding strength enhancing structure 4 with a hollow opening pattern in the water resistant member mounting zone 212. The arrangement of the hollow opening pattern helps controlling the impedance and transmission time of the first metal layer 2. The holes 213 are circular in the embodiment illustrated, but can be of other shapes, such as rhombus, square or rectangle, ellipse, triangle, or other suitable geometric configuration.

Besides controlling impedance and transmission time of the metal layer, the hollow opening pattern formed in the water resistant member mounting zone 212 of the first metal layer 2 is also helpful in improving the bonding strength between the water resistant member mounting zone 212 of the first metal layer 2 and the water resistant member 300.

Figure 7:
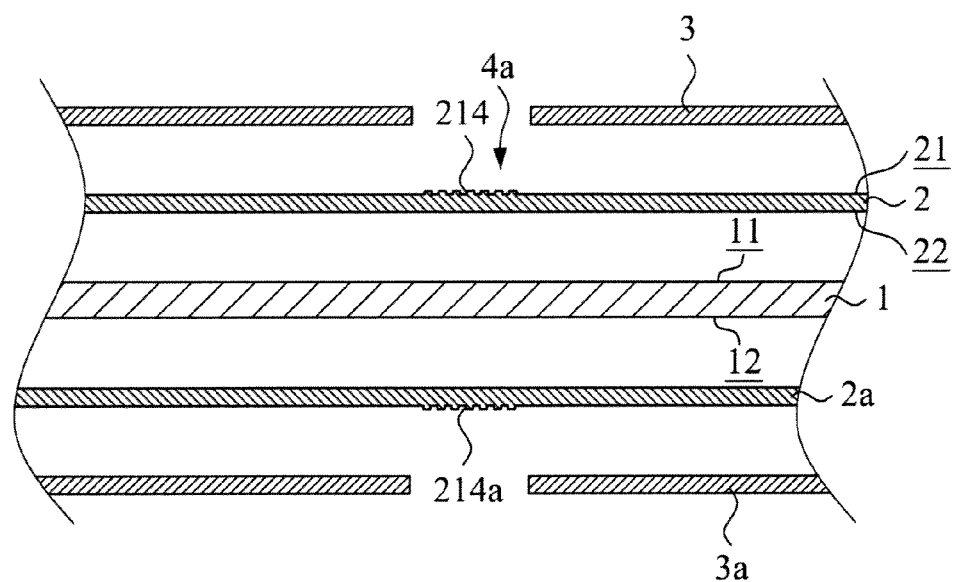
FIG. 7 is a cross-sectional view, in an exploded form, showing a metal layer comprising a corrugation structure formed on a surface thereof.
Figure 8:
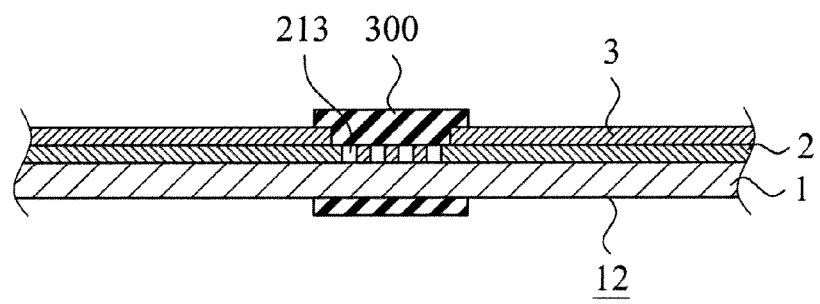
FIG. 8 is a cross-sectional view showing a flexible printed circuit board with water-resistant structure according to a second embodiment of the present invention.

Besides the holes 213 that extends through the upper surface 21 and the lower surface 22 of the first metal layer 2, the water resistant member mounting zone 212 of the first metal layer 2 may alternatively and/or additionally form a corrugation structure 214 (as shown in FIG. 7) that does not extend through the lower surface 22 and the upper surface 21 of the first metal layer 2 so as to form a bonding strength enhancing structure 4a on the upper surface 21 of the first metal layer 2. The corrugation structure 214 help improving the bonding strength between the water resistant member mounting zone 212 of the first metal layer 2 and the water resistant member 300. Similarly, a corrugation structure 214a serving as a bonding strength enhancing structure may be formed on a bottom surface of the second metal layer 2a, as shown in FIG. 7. The corrugation structure 214, 214a can be formed of patterns of circle, rhombus, square or rectangle, ellipse, triangle, or other suitable geometric configurations. In the embodiment described previously, a double-sided flexible printed circuit board is taken as an example of illustration, yet the present invention is also applicable to single-sided or multi-layered flexible printed circuit board. In the example shown in FIG. 8, a flexible substrate 1 has a first surface 11 on which a first metal layer 2 is formed; a first insulation layer 3 is further formed on an upper surface 21 of the first metal layer 2 within a covered area 211; and a water resistant member 300 is securely mounted around an interface area between the water resistant member mounting zone 212 of the first metal layer 2 and the flexible substrate 1. As compared to the previous embodiment shown in FIG. 5, the instant embodiment comprises a flexible substrate 1 having a second surface 12 that comprises no second metal layer 2a and second insulation layer 3a.

Figure 9:
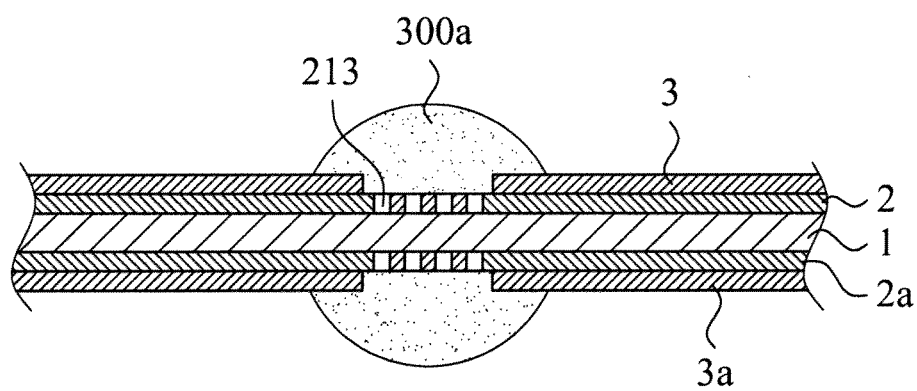
FIG. 9 is a cross-sectional view showing a flexible printed circuit board with water-resistant structure according to a third embodiment of the present invention.

Further, the water resistant member 300, besides being conFIG. d as a regular rectangular form, may be alternatively conFIG. d in other geometric forms, such as a rounded water resistant member 300a (shown in FIG. 9), in order to meet the needs of various device enclosures.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A flexible printed circuit board, comprises:
   a flexible substrate, which has a first surface and a second surface;
   a first metal layer, which has a lower surface and an upper surface, the lower surface being bonded to the first surface of the flexible substrate, the upper surface of the first metal layer forming a covered area and at least one mounting zone, a bonding strength enhancing structure being formed on the mounting zone;
   a first insulation layer, which is formed on the covered area of the upper surface of the first metal layer in such a way to expose the mounting zone of the first metal layer; and
   a water resistant member, which is bonded to the bonding strength enhancing structure of the mounting zone of the first metal layer and the second surface of the flexible substrate.

2. The flexible printed circuit board as claimed in claim 1, wherein the bonding strength enhancing structure of the first metal layer comprises at least one hole extending through the upper and lower surfaces of the first metal layer.

3. The flexible printed circuit board as claimed in claim 2, wherein the hole is of a shape selected from a group consisting of circle, rhombus, rectangle, ellipse, and triangle.

4. The flexible printed circuit board as claimed in claim 1, wherein the bonding strength enhancing structure of the first metal layer comprises a corrugation structure that does not extend through the upper and lower surfaces of the first metal layer.

5. The flexible printed circuit board as claimed in claim 1, wherein the first metal layer is made of a material selected from a group consisting of copper, copper with metallic surface coating, silver paste, silver foil, and aluminum foil.

6. The flexible printed circuit board as claimed in claim 1, wherein the water resistant member is made of a material selected from a group consisting of silicone rubber containing electrically conductive particles, rubber containing electrically conductive particles, silica gel containing electrically conductive particles, and resin containing electrically conductive particles.

7. The flexible printed circuit board as claimed in claim 1, wherein the water resistant member is made of a material selected from a group consisting of silicone rubber, rubber, and silica gel.

8. The flexible printed circuit board as claimed in claim 1, wherein the second surface of the flexible substrate comprises:
   a second metal layer, which has a lower surface and an upper surface, the upper surface being bonded to the second surface of the flexible substrate, the lower surface of the second metal layer forming a covered area and at least one mounting zone, a bonding strength enhancing structure being formed on the mounting zone; and
   a second insulation layer, which is formed on the covered area of the lower surface of the second metal layer in such a way to expose the mounting zone of the second metal layer;
   wherein the water resistant member is bonded to the mounting zones of the first metal layer and the second metal layer.

9. The flexible printed circuit board as claimed in claim 8, wherein the bonding strength enhancing structure of the second metal layer comprises at least one hole extending through the upper and lower surfaces of the second metal layer.

10. The flexible printed circuit board as claimed in claim 9, wherein the hole is of a shape selected from a group consisting of circle, rhombus, rectangle, ellipse, and triangle.

11. The flexible printed circuit board as claimed in claim 8, wherein the bonding strength enhancing structure of the second metal layer comprises a corrugation structure that does not extend through the upper and lower surfaces of the second metal layer.

12. The flexible printed circuit board as claimed in claim 8, wherein the second metal layer is made of a material selected from a group consisting of copper, copper with metallic surface coating, silver paste, silver foil, and aluminum foil.

13. The flexible printed circuit board as claimed in claim 8, wherein the water resistant member is made of a material selected from a group consisting of silicone rubber containing electrically conductive particles, rubber containing electrically conductive particles, silica gel containing electrically conductive particles, and resin containing electrically conductive particles.

14. The flexible printed circuit board as claimed in claim 8, wherein the water resistant member is made of a material selected from a group consisting of silicone rubber, rubber, and silica gel.

* * * * *